(12) United States Patent
Leal

(10) Patent No.: US 9,196,588 B2
(45) Date of Patent: Nov. 24, 2015

(54) EMI SHIELD

(71) Applicant: Invensas Corporation, San Jose, CA (US)

(72) Inventor: Jeffrey S. Leal, Scotts Valley, CA (US)

(73) Assignee: Invensas Corporation, San Jose, CA (US)

( * ) Notice: Subject to any disclaimer, the term of this patent is extended or adjusted under 35 U.S.C. 154(b) by 232 days.

(21) Appl. No.: 13/668,840

(22) Filed: Nov. 5, 2012

(65) Prior Publication Data

US 2013/0114235 A1 May 9, 2013

Related U.S. Application Data

(60) Provisional application No. 61/556,075, filed on Nov. 4, 2011.

(51) Int. Cl.
| H05K 9/00 | (2006.01) |
| H01L 23/552 | (2006.01) |
| H01L 23/29 | (2006.01) |
| H01L 21/56 | (2006.01) |
| H01L 25/065 | (2006.01) |

(52) U.S. Cl.
CPC ............. *H01L 23/552* (2013.01); *H01L 21/565* (2013.01); *H01L 23/295* (2013.01); *H01L 25/0657* (2013.01); *H01L 2223/5442* (2013.01); *H01L 2924/0002* (2013.01)

(58) Field of Classification Search
CPC ...................................................... H05K 9/00
USPC .......................... 361/805–837; 438/100–130
See application file for complete search history.

(56) References Cited

U.S. PATENT DOCUMENTS

| 5,166,772 | A | * | 11/1992 | Soldner et al. | 257/659 |
| 5,189,505 | A | * | 2/1993 | Bartelink | 257/419 |
| 5,473,191 | A | * | 12/1995 | Tanaka | 257/680 |
| 5,495,667 | A | * | 3/1996 | Farnworth et al. | 29/843 |
| 5,614,694 | A | * | 3/1997 | Gorenz et al. | 174/375 |
| 8,008,753 | B1 | * | 8/2011 | Bolognia | 257/659 |
| 2003/0227066 | A1 | * | 12/2003 | Rumer et al. | 257/459 |
| 2007/0052076 | A1 | * | 3/2007 | Ramos et al. | 257/676 |
| 2008/0265421 | A1 | * | 10/2008 | Brunnbauer et al. | 257/758 |
| 2009/0068790 | A1 | * | 3/2009 | Caskey et al. | 438/109 |
| 2009/0206458 | A1 | * | 8/2009 | Andrews et al. | 257/676 |
| 2010/0327461 | A1 | * | 12/2010 | Co et al. | 257/777 |
| 2011/0014746 | A1 | * | 1/2011 | Do et al. | 438/107 |
| 2011/0221054 | A1 | * | 9/2011 | Lin et al. | 257/692 |
| 2011/0261550 | A1 | * | 10/2011 | Wong et al. | 361/818 |
| 2011/0266684 | A1 | * | 11/2011 | Leal | 257/773 |
| 2011/0272825 | A1 | * | 11/2011 | McGrath et al. | 257/777 |
| 2012/0064673 | A1 | * | 3/2012 | Fuergut et al. | 438/127 |
| 2013/0095610 | A1 | * | 4/2013 | Chau et al. | 438/109 |

* cited by examiner

*Primary Examiner* — Courtney Smith
*Assistant Examiner* — Rashen E Morrison
(74) *Attorney, Agent, or Firm* — Lerner, David, Littenberg, Krumholz & Mentlik, LLP

(57) ABSTRACT

An EMI shield can be formed directly on a component, e.g., an unpackaged or packaged semiconductor die, by depositing and curing a curable composition which includes electrically conductive particles and a carrier. In examples, the shield can be configured as a grid or net of electrically conductive traces or lines. The curable electrically conductive material may be applied to the component surface in a flowable form and cured or allowed to cure to form the electrically conductive shield. The shield can be electrically coupled to contacts on an underlying circuit panel or support. The coupling material may be a conductive adhesive, and may be or may include a material the same as, or similar to, the shield material.

11 Claims, 9 Drawing Sheets

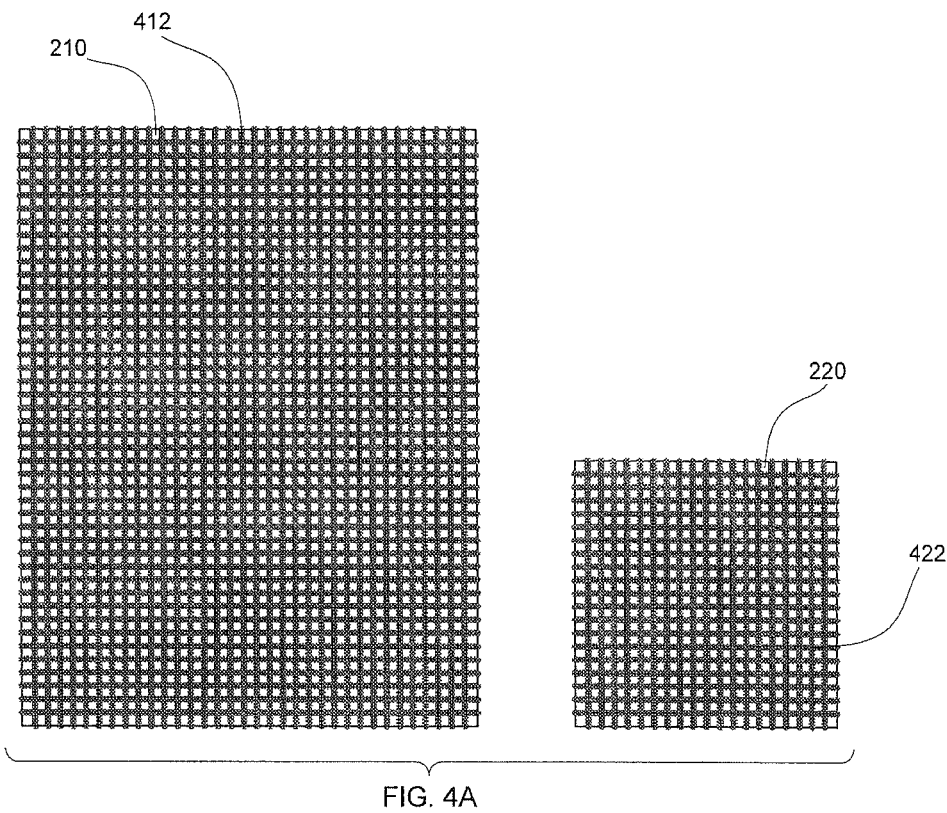
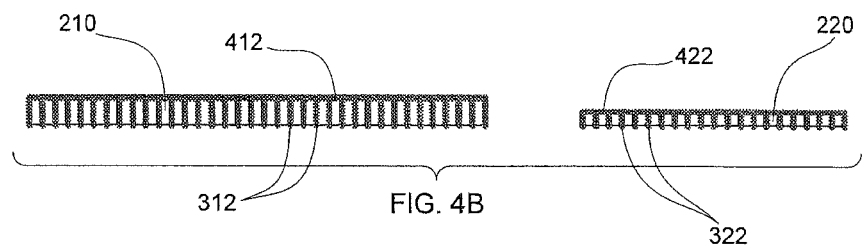

EMI SHIELD

CROSS-REFERENCE TO RELATED APPLICATION

This application claims the benefit of the filing date of U.S. Provisional Application No. 61/556,075 filed Nov. 4, 2011, the disclosure of which is hereby incorporated herein by reference.

BACKGROUND OF THE INVENTION

This disclosure relates to mitigating effects of electromagnetic interference ("EMI"), also known as radio frequency interference ("RFI"), in integrated circuits. Particularly, this disclosure relates to providing an EMI shield in relation to integrated circuit devices.

EMI is disturbance that can degrade or limit the performance of an electrical circuit affected by it. Sources of EMI that may affect a circuit include any object that carries rapidly changing electrical currents. Effectively immunizing a particular device from electromagnetic radiation from an external EMI source, and effectively avoiding damaging or undesirable radiation from a particular device, may require use of an EMI shield. That is, an EMI shield may serve one or both of two purposes: it may be installed over a particular component to shield that component from effects of radiation from sources external to the component; and it may be installed over a particular component to prevent radiation originating in the particular component from affecting surrounding components or devices.

Integrated circuit ("IC") device components, such as ICs used in portable electronics devices such as cell phones, and in electronic equipment, including home entertainment equipment and computers, can be sources of unwanted electromagnetic signals. A portable electronic device such as a cell phone typically contains several IC components (which may be IC chips, IC chip packages, or IC package modules) coupled onto a circuit board, and some of these components may generate EM signals that interfere with the operation of other components in the device. EMI shielding may be required to protect circuitry in an electronic component from a source external to the component (including other electronic components).

In one approach to protecting components from EMI, shielding can be constructed over the components. The shield is constructed of an electrically conductive material such as sheet metal (which may be perforated) or metal screen, electrically coupled to a reference potential, which may be ground, for example. It is typically formed as a box installed over the component to be shielded and soldered to contact points on the circuit board surrounding the component. Alternatively, a frame may be soldered to contact points on the circuit board, and a sheet metal cover may be snap-coupled to the frame over the component. Undesirably, such a shield adds weight and bulk (thickness, length and width) to the device in which it is used.

In another approach to constructing a shield, layers of material are applied onto the circuit board and the components: a first layer provides waterproofing or water resistance, and is of a non-conductive material; and a second layer, applied over the first, is of a conductive material and provides EMI shielding. Contact pads on the circuit board are exposed by openings through the first layer, and the second layer is electrically coupled to the contact pads.

EMI shields as disclosed herein are formed by application of the shield material where it is needed to provide the desired shielding effect. Accordingly less of the shielding material is required than would be deployed in a configuration in which the component is fully covered by the shield material, or in a configuration in which the shield material is applied fully over a broad area including the components and then removed in part from areas where it is not needed, or otherwise to form openings (as in "subtractive" processes). Moreover, because the topside of the component is applied as a grid, the shield can be "tuned" to selectively block or allow passage (admission or transmission) of frequencies in various ranges and/or in ranges of various widths in the electromagnetic spectrum. Depending upon the functionality of the particular component, or upon the functionalities of particular regions within the component, it may be desirable to "tune" one or more areas of the component surface differently than others.

SUMMARY OF THE INVENTION

In one general aspect this disclosure features EMI shielding formed directly upon a nonconductive surface of an electronic component. The EMI shield is formed of a curable electrically conductive material, and is configured generally as a grid or net of electrically conductive traces or lines. The curable electrically conductive material is applied to the component surface in a flowable form and thereafter is cured or allowed to cure to form the electrically conductive shield. The shield is electrically coupled to contacts on the underlying support, which may be a circuit board or package substrate, for example. The coupling material may be a conductive adhesive, and may be or may include a material the same as, or similar to, the shield material.

In another general aspect this disclosure features methods for forming EMI shielding for an electronic component.

In some embodiments the shield is formed on the component prior to mounting the component onto a support such as a printed circuit board or a package substrate. In other embodiments the shield is formed subsequent to mounting the component onto the support.

In some embodiments the component to be shielded may as provided be electrically insulated, at least over the surface onto which the conductive material of the shield is to be applied. For example, the component may be an encapsulated or molded package, in which the molding or encapsulation is a dielectric material. Alternatively, for example, the component may be a die that has been covered by an electrically insulative material.

In some embodiments the surface of the component may as provided may not be adequately electrically insulated over the surface onto which the conductive material of the shield is to be applied. In such embodiments a conformal coating may be applied over the inadequately insulated surface prior to applying the shield material. Particularly suitable conformal coatings include, for example, any of a variety of organic polymers such as parylenes.

In some embodiments the shield material is applied by dispensing in a pattern of spaced-apart lines; in some embodiments the shield material is applied by printing through a patterned screen or mask; in some embodiments the shield material is applied by transfer printing; in some embodiments the shield material is applied by injection molding.

In one example, a shielded component according to an aspect of the invention includes a component having a surface and sidewalls extending away from the surface. The shielded component can have an electrically conductive shield formed on the surface and at least one of sidewalls. The shield may include an open pattern of an electrically conductive material. The open pattern may be formed by depositing and curing a curable composition comprising conductive particles and a carrier material on first portions of the surface and on the at least one sidewall while leaving second portions of the surface free from the deposited composition.

In one or more examples, the shielded component may be mounted to a circuit panel having an electrically conductive pad at a surface of the circuit panel. The shield may be electrically coupled to the pad through a portion of the electrically conductive material contacting at least the pad.

In one or more examples, the component can be a packaged semiconductor die.

In one or more examples, the component can be a packaged semiconductor die having an encapsulation. In such case, the surface can be a surface of the encapsulation, the sidewalls can be sidewalls of the encapsulation, or the surface and the sidewalls may be those of the encapsulation.

In one or more examples, the component can be an unpackaged semiconductor die, and the surface can be a surface of the unpackaged die.

In one or more examples, the component can include a first semiconductor die and a second semiconductor die stacked atop the first semiconductor die, and the second semiconductor die can be disposed at or below the surface of the component.

In one or more examples, the pattern of the electrically conductive material can include a plurality of first lines of the electrically conductive material extending in a first direction, and a plurality of second lines of the electrically conductive material extending in a second direction transverse to the first direction, such that at least some of the second lines cross at least some of the first lines.

In one or more examples, the second direction can be orthogonal to the first direction such that the at least some first lines and the at least some second lines form an orthogonal grid.

In one or more examples, the second direction can be other than orthogonal to the first direction. The at least some second lines may cross the at least some first lines at intersections which can be non-orthogonal.

In one or more examples, the first portions of the surface can define at least one continuous area and the second portions can be fully enclosed within the at least one continuous area such that the open pattern has an appearance of a perforated sheet.

In one or more examples, the shield can further include a solid pattern of the electrically conductive material deposited and cured with the open pattern.

In one or more examples, a logo can be unobstructed from view at the surface of the component notwithstanding the electrically conductive material.

A shielded component according to another aspect of the invention can include a component having a surface and sidewalls extending away from the surface. An electrically conductive shield can overlie the surface and at least one of the sidewalls, the shield formed of a curable material deposited onto the surface and cured thereon, wherein the curable material can include electrically conductive particles and a carrier.

A method of forming a shielded component according to an aspect of the invention can include forming an electrically conductive shield which includes an open pattern of an electrically conductive material by depositing and curing a curable composition comprising electrically conductive particles and a carrier material on first portions of a surface of a component and on at least one sidewall extending away from the surface, such that at least second portions of the surface can be free from the deposited composition.

In one or more examples, the component can be mounted to a circuit panel having an electrically conductive pad at a surface of the circuit panel. The method may further include depositing and curing a quantity of the curable composition onto at least the pad to electrically couple the shield with the conductive pad.

In one or more examples, the component can be a packaged semiconductor die.

In one or more examples, the component can be a packaged semiconductor die having an encapsulation, wherein at least one of: the surface can be a surface of the encapsulation, or the sidewalls can be sidewalls of the encapsulation.

In one or more examples, the component can be an unpackaged semiconductor die, and the surface can be a surface of the unpackaged die.

In one or more examples, the component can include a first semiconductor die and a second semiconductor die stacked atop the first semiconductor die, wherein the second semiconductor die can be disposed at or below the surface of the component.

In one or more examples, the pattern of the electrically conductive material can include a plurality of first lines of the electrically conductive material extending in a first direction, and a plurality of second lines of the electrically conductive material extending in a second direction transverse to the first direction such that at least some of the second lines cross at least some of the first lines.

In one or more examples, the second direction can be orthogonal to the first direction. In such case, at least some first lines and the at least some second lines may form an orthogonal grid.

In one or more examples, the second direction can be other than orthogonal to the first direction. In such case, the at least some second lines may cross the at least some first lines at intersections which can be non-orthogonal.

In one or more examples, the first portions of the surface can define at least one continuous area and the second portions can be fully enclosed within the at least one continuous area. In such case, the open pattern can have an appearance of a perforated sheet.

In one or more examples, the shield can further include a solid pattern of the electrically conductive material deposited and cured with the open pattern.

In one or more examples, a logo can be unobstructed from view at the surface of the component notwithstanding the electrically conductive material.

BRIEF DESCRIPTION OF THE DRAWINGS

FIGS. 2A, 2B, 3A, 3B, 4A, 4B, 5A, and 5B are diagrammatic sketches showing stages in providing shielding onto electronic components according to an embodiment. FIGS. 2A, 3A, 4A, and 5A are in a plan view; and FIGS. 2B, 3B, 4B and 5B are in an elevational view.

FIG. 8A is a plan view and FIG. 8B is an elevational view.

FIGS. 9A, 9B, and 9D are transverse sectional views; FIG. 9C is an elevational view.

DETAILED DESCRIPTION

The invention will now be described in further detail by reference to the drawings, which illustrate alternative embodiments. The drawings are diagrammatic, showing features in accordance with embodiments of the invention and their relation to other features and structures, and are not made to scale. For improved clarity of presentation, in the figures illustrating embodiments, elements corresponding to elements shown in other drawings are not all particularly renumbered, although they are all readily identifiable in all the Figs. Also for clarity of presentation certain features are not shown in the figures, where not necessary for an understanding of the embodiments of the invention shown and described herein.

Figure 1A:
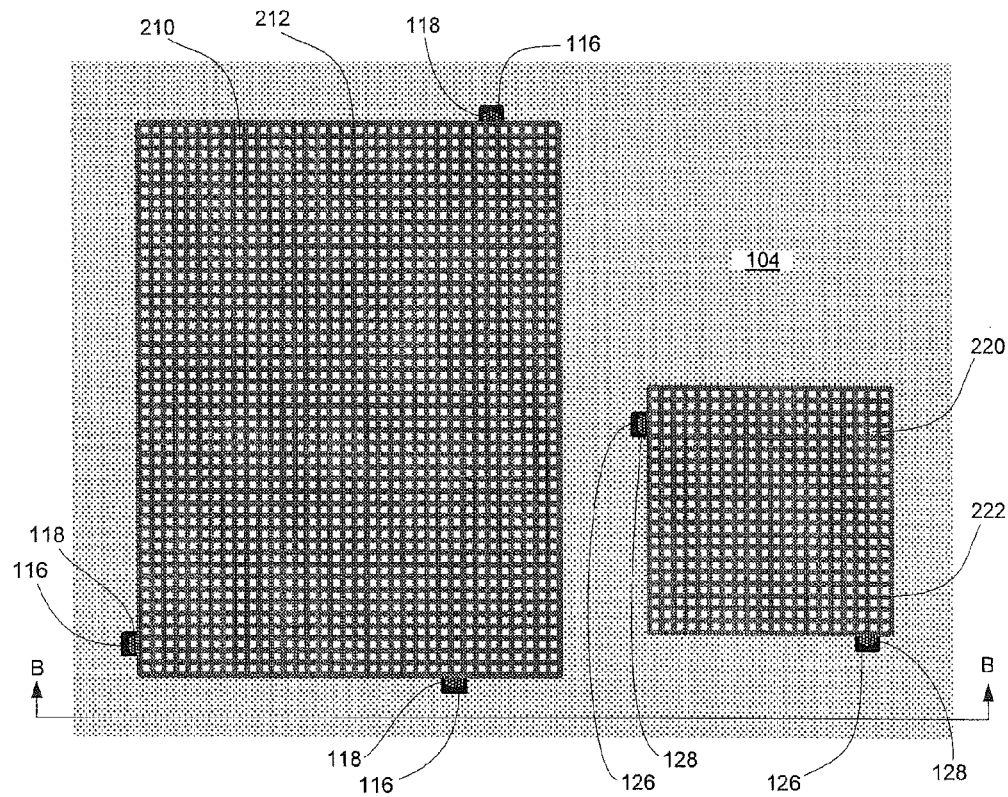
FIG. 1A is a diagrammatic sketch in a plan view showing a portion of a circuit board on which are mounted two integrated circuit components, shielded according to an embodiment.
Figure 1B:
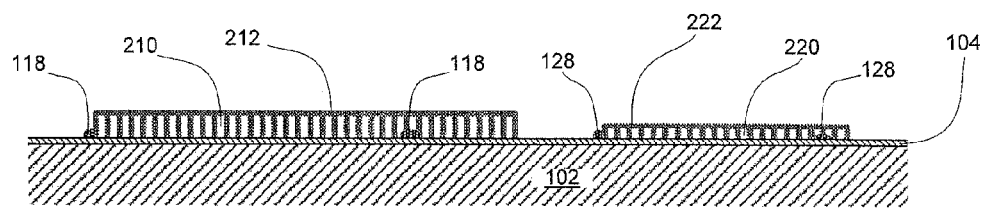
FIG. 1B is a diagrammatic sketch showing the circuit board-mounted shielded integrated circuit components of FIG. 1A in an elevational (lateral) view.

Turing now to FIGS. 1A and 1B, a construct is shown including two shielded components mounted onto a circuit board. In this example each component 210, 220 is covered by shield 212, 222 consisting of an orthogonal grid of traces of electrically conductive material. The circuit board includes a body 102 which contains electrical circuitry (not shown in the figures) as is well known. The circuit board body is covered by a passivation layer 104. Openings 116, 126 in the passivation layer expose contacts for electrical connection of the shields to a reference potential (such as ground). The connection is made in this example by way of spots 118, 128 of electrically conductive material, which contact the shields and the contacts on the circuit board and thereby couple the shields to circuitry at the reference potential. Any number of contacts may be provided in the circuit board, and any number (one or more) contacts may be exposed for connection to the shield(s). The contacts may be discrete, as in the examples shown in the figures; in other examples it may be desirable to provide a contact that ranges along part or all the length of one ore more sides of the component footprint, adaptable for connection at any number of points on, or an area of, the shield sidewall along that edge.

The shields may be formed subsequent to mounting the components on the support (circuit board in this example); or the shields may be formed on the components prior to mounting the components on the board.

FIGS. 2A, 2B, 3A, 3B, 4A, 4B, 5A, and 5B illustrate stages in an example of a procedure for forming shields on the components prior to mounting the components onto the support. In the example shown here, the shields are formed by dispensing lines or traces of conductive material in flowable form and subsequently curing the lines.

The lines are shown as being dispensed in stages: lines are applied to the sidewalls of the components, over the top surface of the component, and in a linking frame around the upper edges of the component where the top surface meets the sidewalls. The application need not be carried out in discrete stages and, where the lines are applied in discrete stages, the stages may be carried out in any of various sequences.

Figure 2A:
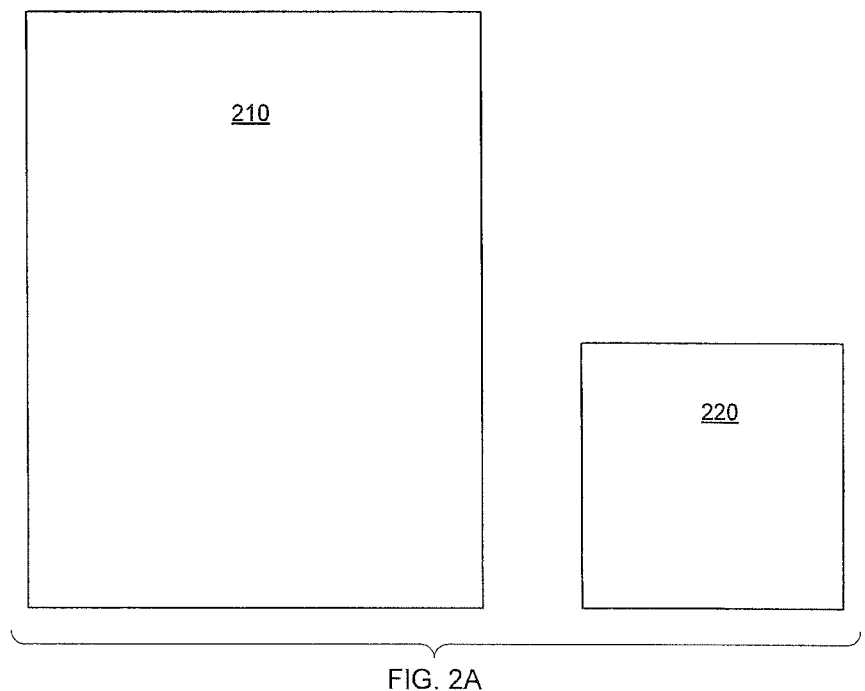
Figure 2B:
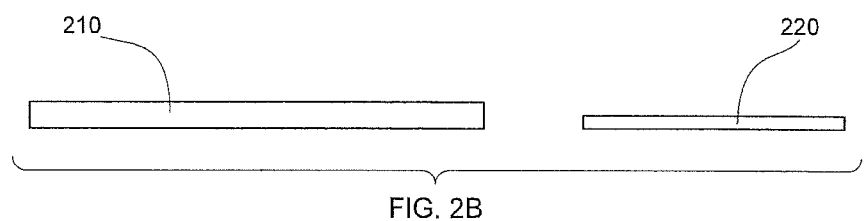

FIGS. 2A and 2B show two components 210, 220 ready for application of the shield material. The two components are presumed to be electrically insulated over at least the surfaces to which the shield material is to be applied. They may be, for example, molded or encapsulated LGA or BGA packages. The components may be temporarily mounted on a carrier for manipulation through the various steps. Typically components of a particular type or size may be mounted in an array on a carrier, for treatment as a group.

Figure 3A:
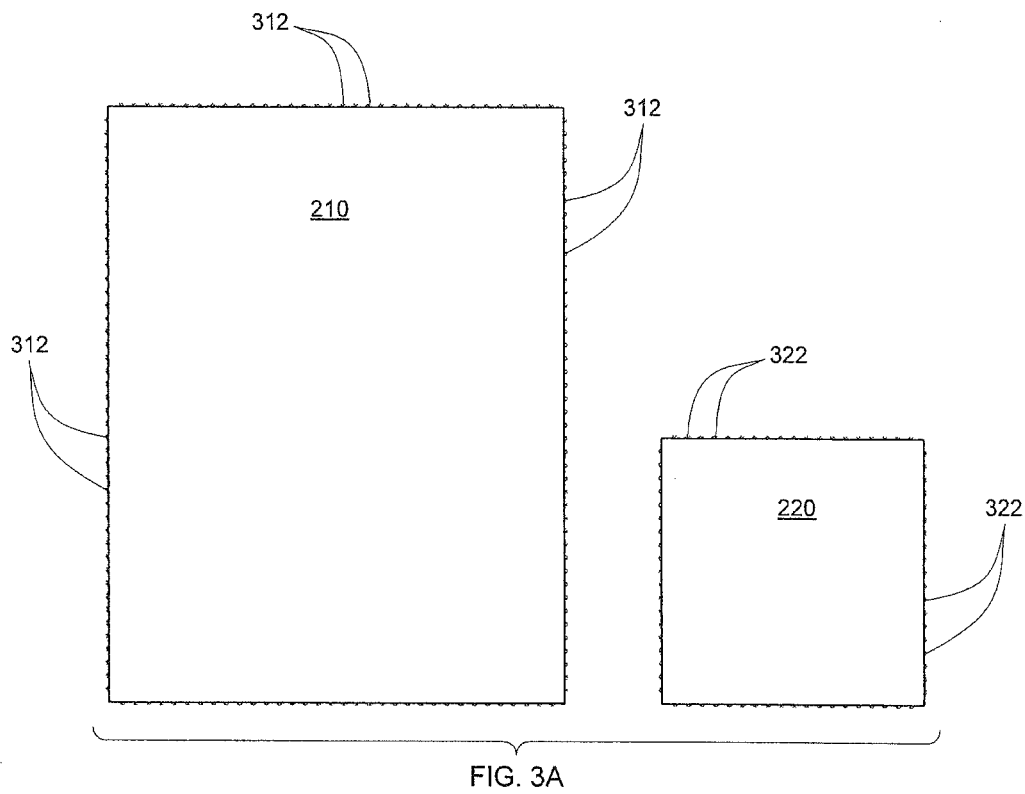
Figure 3B:
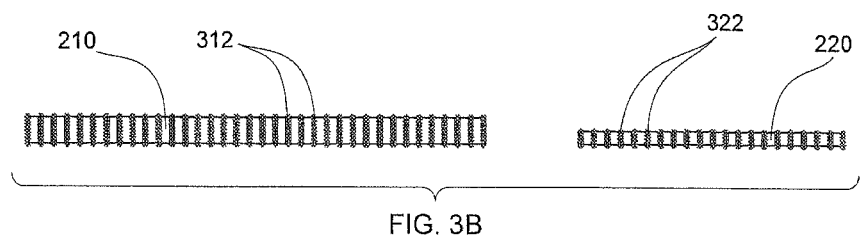

In a dispense stage shown in FIGS. 3A, 3B lines 312, 322 of shield material are dispensed onto the sidewalls of the components 210, 220. The lines may be dispensed using robotically controlled dispense apparatus. The lines may be dispensed in any of a variety of ways (some examples are outlined below). The lines may be dispensed one at a time using a single dispense tool, or in groups using ganged dispense tools.

In a dispense stage shown in FIGS. 4A, 4B lines 412, 422 of shield material are dispensed in an orthogonal grid onto the top surface of the components 210, 220. As noted above (and outlined below), the lines may be dispensed using robotically-controlled dispense apparatus; they may be dispensed in any of a variety of ways, and they may be dispensed one at a time using a single dispense tool, or in groups using ganged dispense tools. All the parallel lines having one orientation may be dispensed in one substage and all the parallel lines having another orientation (perpendicular to the first, in an orthogonal arrangement as shown in this example) may be dispensed in another substage. Alternatively, the lines may be dispensed in any sequence.

Figure 5A:
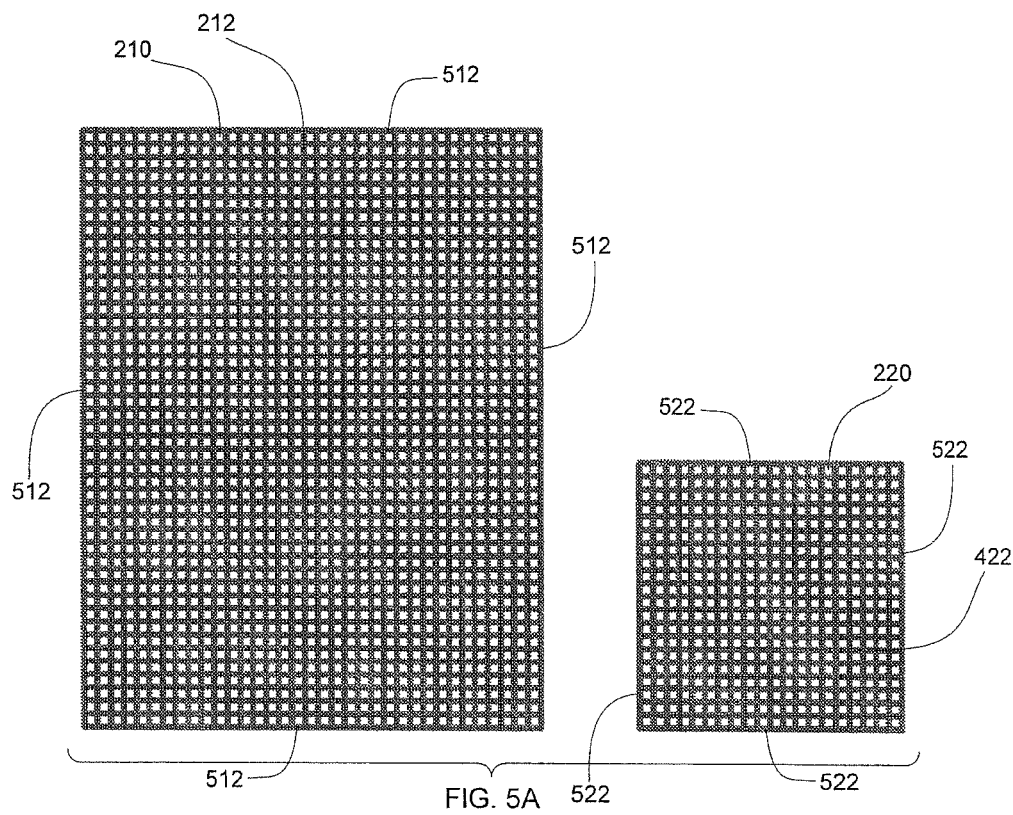
Figure 5B:
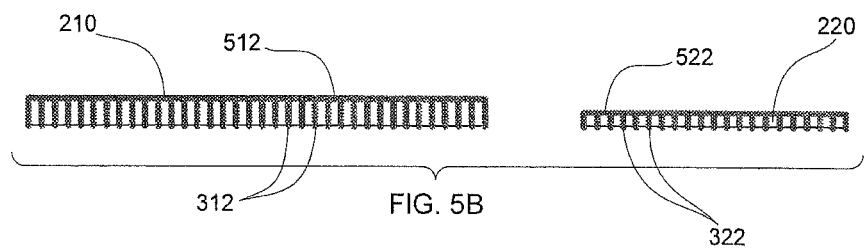

In a dispense stage shown in FIGS. 5A, 5B lines 512, 522 of shield material are dispensed along the edges of the components 210, 220 where the sidewalls meet the top surface. This forms a frame ensuring that the lines formed at the sidewalls are well-coupled to the lines in the grid formed at the top surface. These lines may be dispensed along one edge at a time, or as a continuous line following the rectangular (or square) contour of the component. As noted above (and outlined below), the lines may be dispensed using robotically-controlled dispense apparatus; they may be dispensed in any of a variety of ways.

When formation of all the lines has been completed (or as the stages on forming the lines are completed), the material is cured or allowed to cure; or the material my at any stage be partially cured or allowed to partially cure, and completion of the cure may be carried out later.

In particular examples, the traces or lines making up the shield are formed of a conductive material that is applied in flowable form, and then cured or allowed to cure to complete the electrically conductive traces or lines. The material may or may not be electrically conductive to at least some extent in flowable form. Where the material as applied prior to cure is nonconductive, or is conductive to an insufficient extent, the cure renders the material sufficiently electrically conductive or the material may be.

Such materials include, for example, electrically conductive polymers, including electrically conductive particulates (e.g., conductive metal particles) contained in a curable organic polymer matrix (for example, conductive (e.g., filled) epoxies, or electrically conductive inks); and include, for example, electrically conductive particulates delivered in a liquid carrier. In particular embodiments the interconnect material is a conductive polymer such as a curable conductive polymer, or a conductive ink. For some such materials, as may be appreciated, the cure may comprise a sintering process.

In some examples the conductive material of the shield includes electrically conductive particles in a curable polymer matrix, such as a curable epoxy. In particular such examples, the conductive material includes particles of Bismuth, Copper, and Tin, in an epoxy matrix; in other such examples the conductive material includes particles of Bismuth, Copper, Tin, and Silver in an epoxy matrix.

Particular examples of suitable shield materials include electrically conductive pastes that include an organic polymer with various proportions of particles of Cu, Bi and Sn, or Cu, Bi, Sn and Ag. During cure, these materials can form intermetallics in the trace itself (particularly, for example, CuSn intermetallics) during cure; and where the surface of a connection site is provided with gold, for example, these materials can form AuSn intermetallics at the interface of the trace and the surface of the pad or site.

Other particular examples of suitable interconnect materials include silver-filled epoxies.

The interconnect material can be applied using an application tool such as, for example, a syringe or a nozzle or a needle. The material exits the tool in a deposition direction generally toward the die pad or interconnect terminal or bond site, and the tool is moved over the presented stack face in a work direction to form a trace or line. The material may be extruded from the tool in a continuous flow; or, the extrusion of the material may be pulsed; or, the flow may be interrupted by valving; or, the material may exit the tool dropwise. In some embodiments the material exits the tool as a jet of droplets, and is deposited as dots which coalesce upon contact, or following contact, with a stack face surface. Various modes of pulse dispense are described in T. Caskey et al. U.S. patent application Ser. No. 12/124,097, titled "Electrical interconnect formed by pulsed dispense", which was filed May 20, 2008, and which is hereby incorporated by reference herein.

In some examples the traces are formed one at a time. In some examples more than one interconnect trace is formed in a single interconnect operation, and in some such examples all the interconnect traces on a given assembly are formed in a single operation (or in a number of operations fewer than the number of traces). The application tool may in such instances include a number of needles or nozzles ganged together in a row generally parallel to the die edges.

The lines are dimensioned so that in the cured state they provide reliable electrical continuity, and so that they have suitable conductive characteristics (particularly, the shield must have a suitably low resistivity). These characteristics can be determined depending upon the properties of the particular conductive material. The line pitch is dimensioned so that the shield provides sufficient blocking of RF signals over the range of frequencies that are sought be suppressed.

Because the open pattern of the shield can be designed (in the x-y or in the x-y-z sense) according to desired shielding effects of parts of the area of the shield, or of the entire area of the shield, in various embodiments the shield can be designed to provide designed shielding characteristics over various areas of the shielded component.

In a particular example, the shield material may be a silver-filled epoxy, marketed under the product name Lord MD 141; the lines may have a width about 200 um and may have a thickness (over the surface) about 100 um or greater; and the line pitch may be about 400 um.

Figure 6:
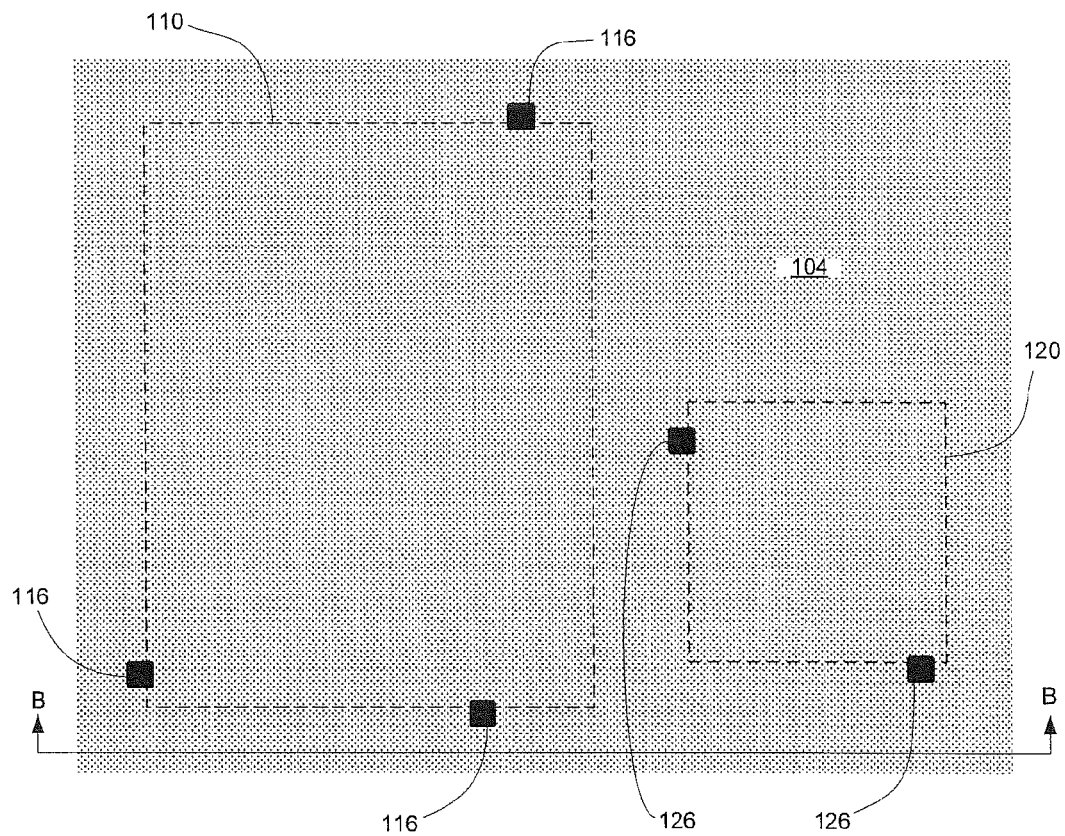
FIG. 6 is a diagrammatic sketch in plan view of a portion of a circuit board onto which shielded components such as are shown in FIGS. 5A, 5B are to be mounted.
Figure 7:
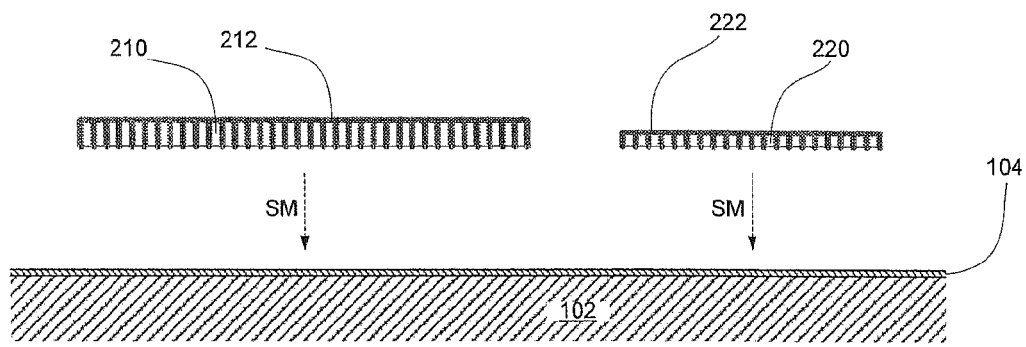
FIG. 7 is a diagrammatic sketch in elevational view showing a stage in mounting shielded components such as are shown in FIGS. 5A, 5B onto a circuit board such as is shown in FIG. 6.

FIG. 6 shows a portion of a substrate prepared to receive shielded components as shown in FIGS. 5A, 5B. The substrate body 102 is provided on a mounting surface 104 with connect pads 116, 126, arranged adjacent the areas where the components are to be mounted (indicated in FIG. 7 by broken outlines 110, 120. The shielded components are mounted using surface mount apparatus, moving the components toward the circuit board as indicated by the broken arrows SM, completing the electrical connection of the components 210, 220 with circuitry in the circuit board (not shown in the figures), and then applying connecting spots to electrically connect the shields 212, 222 to the connect pads 116, 126.

Figure 8A:
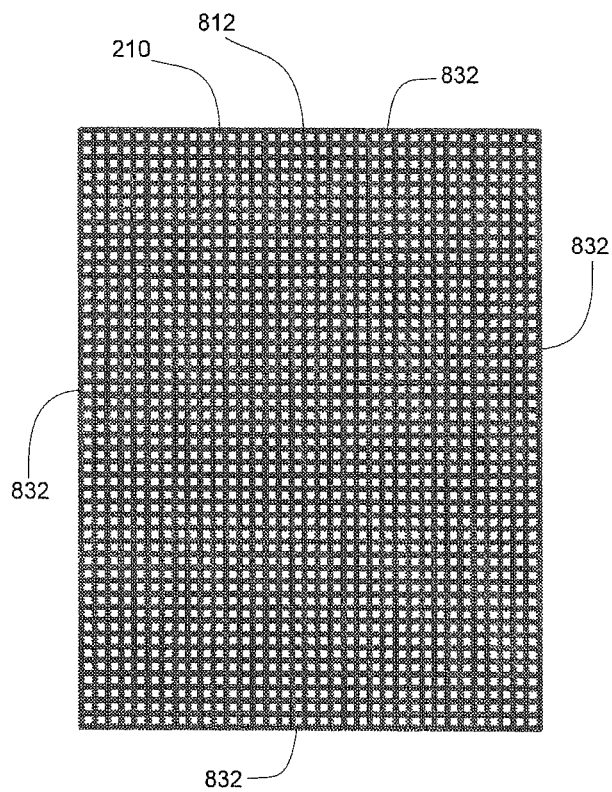
FIGS. 8A and 8B are diagrammatic sketches showing a shielded component according to an embodiment.
Figure 8B:
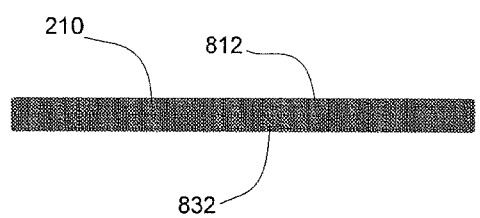

In the foregoing examples, the sidewalls of the component, as well as the top surface, are covered with an open pattern of shield material. In other examples, one or more of the sidewalls (or parts of one or more sidewalls) may be fully covered by shield material. In the example shown in FIGS. 8A and 8B the top surface of the component 210 is provided with an open pattern (grid) 812 of shield material, while the sidewalls 832 are fully covered with shield material.

As noted above, the components (or one or more components) may be mounted onto the circuit board prior to shielding, by whatever method may be employed.

In the example above, the shield materials is dispensed in lines. The apparatus may dispense the material in a continuous line; or it may dispense the material in a pulsed manner, forming a series of overlapping dots. The dispense nozzle may be placed near the target or at some distance so that the dots are ejected ballistically toward the target. Dispense nozzles may be arrayed so that several parallel lines are dispensed in tandem.

Alternatively, the dispense nozzles may be configured in a close array, and the shield material may be applied in a manner similar to jet printing to form the desired pattern.

In other embodiments the material may be applied in flowable form by printing through a suitable patterned mask or screen.

Such printing approaches may be adapted to apply the shield material in a desired pattern over the top and the sidewalls of the component; or they may be employed to apply the shield material in a desired pattern over the top surface in one stage and over the sidewalls in another stage; or the shield material may be applied over the sidewalls using a process other than printing, and the top may be applied in a desired pattern by a printing process.

In other embodiments the material may be applied by transfer printing. In such embodiments, the shield material is applied in flowable form in the desired pattern onto a release surface; then the release surface is contacted onto the top and sidewalls of the component, and the shield material transfers to the surfaces of the component as the release surface is lifted away. The release surface may be constructed so that when pressed upon the component the surface conforms to the top and sidewalls of the component, and when lifted away from the component it leaves the desired pattern of shield material over the top and sidewalls. The release surface may be, for example, a surface of a suitably elastically compressible body; or it may be, for example, a membrane (release liner) supported by a suitably elastically compressible body, or by a fluid or gel.

In other embodiments the patterned shield material may be formed on the component by injection molding. An example of part of mold apparatus is shown in various sectional views in FIGS. 10A, 10B, 10C and 10D. The mold apparatus includes a cavity configured to accommodate the component, and various of the walls of the cavity have channels corresponding to the pattern of the shield material. The shield material is injected into the mold cavity in flowable form and then is cured (or at least partly cured), and then the shielded component is released form the cavity. As will be appreciated, the injection molding apparatus may include many such mold cavities, served by the apparatus in tandem.

And as will be appreciated, the mold cavity may be configured to accommodate a support (such as a circuit board or package substrate) having an unshielded component (or components) mounted thereon, and in such arrangements the shield may be formed by injection molding with the component(s) in place on the board. In this arrangement, too, the injection molding apparatus may include many such mold cavities, served by the apparatus in tandem.

In the foregoing examples the shield constitutes the exposed surface of the shielded component. In some such examples the component is an encapsulated or molded package or package module. In other examples it may be desirable to shield a nonencapsulated (nonmolded) die or stack of die, and later to mold or encapsulate the shielded die.

Figure 9A:
FIGS. 9A, 9B, 9C and 9D are diagrammatic sketches showing stages in providing shielding onto an electronic component according to another embodiment.
Figure 9B:
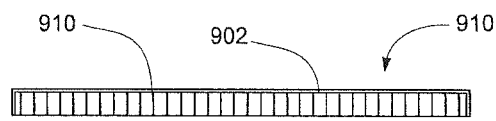
Figure 9C:
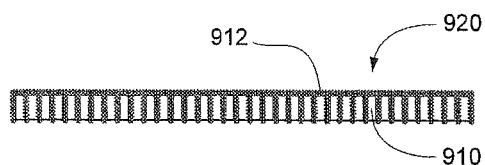
Figure 9D:
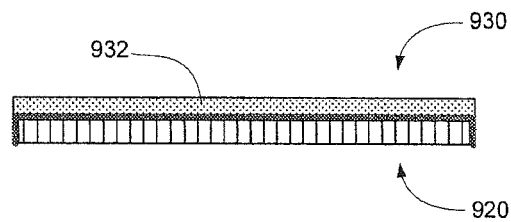
Figure 10A:
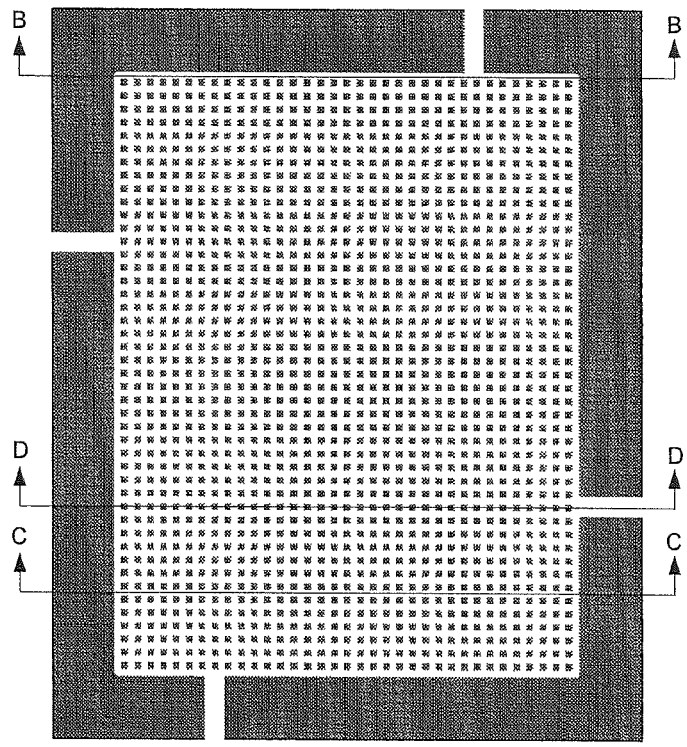
FIGS. 10A, 10B, 10C and 10D are diagrammatic sketches in sectional views showing part of injection molding apparatus suitable for preparing an EMI shield onto a component according to an embodiment.
Figure 10B:
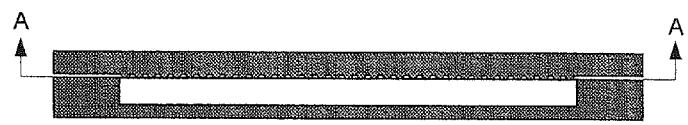
Figure 10C:
Figure 10D:
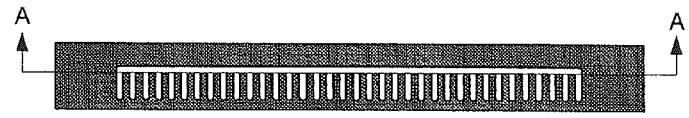

Stages in a process for shielding and subsequently molding a semiconductor die are illustrated in FIGS. 9A-9D. A die 910 is shown in transverse sectional view in FIG. 910. The die 910 in this example has electrically conductive surfaces; it may be, for example, a "bare" die, or a die that has been provided with rerouting circuitry over one or more surfaces. As will be appreciated, the surfaces of the die over which the shield material is to be applied must be electrically insulated. FIG. 9B shows an insulated die 910, consisting of a die 910 covered over the top and sidewalls with a coating 902 of an electrically insulative material. Any of a variety of materials may be used to form the coating. Suitable materials include inorganic polymers; and particularly polymers that may be applied using CVD, such as any of the parylenes, for example. FIG. 9C shows, in elevational view, a shielded component 920, including an insulated die 910 provided with a shield as described generally with reference to FIGS. 5A, 5B. FIG. 9D shows an encapsulated component (module) 930, including a shielded die 920 molded or covered with an encapsulant 932. In such examples the top area of the shield is enclosed by the encapsulant or molding, which constitutes the top surface of the completed component (module). In the illustrated embodiment the shielding over two (opposite) sidewalls is left uncovered by the encapsulant; in other examples all four sidewalls may be covered by encapsulant, or any one, two, three or al of the sidewalls may be left uncovered. In example where a sidewall is left uncovered, connection of the shield may be made at exposed parts of the shield to sites at a reference potential (e.g., ground) on the circuitry in the support. In examples where all the sidewalls are exposed, connection may be made at exposed parts of the shield on the bottom side to sites located near the edge of the footprint. Alternatively, for example, where the shielded die is mounted on a package substrate (such as a BGA or LGA substrate, the shield may be connected to connection sites on the upper surface of the substrate, and the connection sites may be connected by circuitry within the substrate to lands or ball bond sites on the lower surface of the substrate.

Multiple encapsulated or molded components may be provided with shielding by, for example: arranging a number of the components in an array on a support; flooding the array of components with encapsulant or molding material; curing the molding or encapsulant to form a panel; cutting on streets between the components (scribing, for example using a saw) from the top side nearly all the way though the panel, to form component sidewalls; applying the shield material over the scribed panel (for example by printing), so the material is applied in a desired pattern on the top and sidewalls; curing the shield material to complete the shield in the desired pattern; and, cutting all the way through the panel using a narrower cut (for example, using a narrower saw) on the same streets, to singulate the components.

Two or more die may be stacked and electrically interconnected and shielded. The die may be shielded prior to stacking (each die being provided with a shield); or the die may be stacked and then provided with a shield over the stack.

The pattern on the top surface of the component is shown in the forgoing examples as having a configuration consisting of a grid of lines in an open orthogonal pattern of parallel lines— that is, with spaces between adjacent lines. An open pattern has the advantage that it requires less material than a continuous covering. Other open patterns are contemplated. For example, the configuration may be a gridwork of lines forming a triangular or hexagonal pattern. Alternatively, the configuration when completed may have the appearance of a perforated sheet. Alternatively, the configuration may include some areas having an open pattern, and other areas having a different open pattern or a partially-closed pattern. In the latter configuration it is possible to have an open gridwork over much of the area of the top surface, with a chosen logo appearing over a selected area of the top surface.

Various features of the above-described embodiments of the invention can be combined in ways other than as specifically described above without departing from the scope or spirit of the invention. It is intended for the present disclosure to cover all such combinations and variations of embodiments of the invention described above.

The invention claimed is:

1. A method of forming a shielded component, comprising: forming an electrically conductive shield including an open pattern of an electrically conductive material by depositing and curing a curable composition comprising electrically conductive particles and a carrier material on first portions of a surface of a component and on at least one sidewall extending away from the surface, such that at least second portions of the surface are free from the deposited composition, wherein the pattern of the electrically conductive material includes a plurality of first lines of the electrically conductive material extending in a first direction, and a plurality of second lines of the electrically conductive material extending in a second direction transverse to the first direction such that at least some of the second lines cross at least some of the first lines and the first and second lines surround open areas above at least some of the second portions.

2. The method of claim 1, wherein the component is mounted to a circuit panel having an electrically conductive pad at a surface of the circuit panel, wherein the method further comprises depositing and curing a quantity of the curable composition onto at least the pad to electrically couple the shield with the conductive pad.

3. The method of claim 2, wherein the component includes a first semiconductor die and a second semiconductor die stacked atop the first semiconductor die, wherein the second semiconductor die is disposed at or below the surface of the component, and each of the first and second semiconductor dies overlie the surface of the circuit panel.

4. The method of claim 1, wherein the component is a packaged semiconductor die.

5. The method of claim 1, wherein the component is a packaged semiconductor die having an encapsulation, and at least one of: the surface is a surface of the encapsulation, or the sidewalls are sidewalls of the encapsulation.

6. The method of claim 1, wherein the component is an unpackaged semiconductor die, and the surface is a surface of the unpackaged die.

7. The method of claim 1, the second direction is orthogonal to the first direction such that the at least some first lines and the at least some second lines form an orthogonal grid.

8. The method of claim 1, wherein the second direction is other than orthogonal to the first direction such that the at least some second lines cross the at least some first lines at intersections which are non-orthogonal.

9. The method of claim 1, wherein the first portions of the surface defines at least one continuous area and the second portions are fully enclosed within the at least one continuous area such that the open pattern has an appearance of a perforated sheet.

10. The method of claim 1, wherein the shield further includes a solid pattern of the electrically conductive material deposited and cured with the open pattern.

11. The method of claim 10, wherein a logo is unobstructed from view at the surface of the component notwithstanding the electrically conductive material.

\* \* \* \* \*